(12) United States Patent
Hongo et al.

(10) Patent No.: US 6,929,722 B2
(45) Date of Patent: Aug. 16, 2005

(54) SUBSTRATE PLATING APPARATUS

(75) Inventors: Akihisa Hongo, Yokohama (JP); Naoaki Ogure, Tokyo (JP); Hiroaki Inoue, Machida (JP); Norio Kimura, Fujisawa (JP); Fumio Kuriyama, Yokohama (JP); Manabu Tsujimura, Yokohama (JP); Kenichi Suzuki, Fujisawa (JP); Atsushi Chono, Fujisawa (JP)

(73) Assignee: Ebara Corporation, Tokyo (JP)

( * ) Notice: Subject to any disclaimer, the term of this patent is extended or adjusted under 35 U.S.C. 154(b) by 423 days.

(21) Appl. No.: 09/945,711

(22) Filed: Sep. 5, 2001

(65) Prior Publication Data

US 2002/0005359 A1 Jan. 17, 2002

Related U.S. Application Data

(62) Division of application No. 09/154,895, filed on Sep. 17, 1998, now Pat. No. 6,294,059.

(30) Foreign Application Priority Data

| Sep. 17, 1997 | (JP) | 9-270493 |
| Mar. 5, 1998 | (JP) | 10-71370 |
| Mar. 26, 1998 | (JP) | 10-96974 |
| Jul. 21, 1998 | (JP) | 10-205138 |

(51) Int. Cl.[7] .......................... C25D 17/00; C23B 3/00; H01M 4/29
(52) U.S. Cl. .................. 204/198; 204/224 R; 204/269; 204/270; 118/66; 118/423; 118/429
(58) Field of Search .............. 204/198, 224 R, 204/269, 270; 118/66, 428, 423, 429, 500; 427/443.1, 443.2, 307, 299; 424/314

(56) References Cited

U.S. PATENT DOCUMENTS

| 3,649,509 A | * | 3/1972 | Morawetz et al. .......... 204/238 |
| 4,789,438 A | | 12/1988 | Polan |
| 5,092,975 A | | 3/1992 | Yamamura et al. |
| 5,368,715 A | | 11/1994 | Hurley et al. |
| 5,415,890 A | | 5/1995 | Kloiber et al. |
| 5,616,063 A | | 4/1997 | Okumura et al. |
| 5,679,059 A | | 10/1997 | Nishi et al. |
| 5,723,387 A | | 3/1998 | Chen |
| 5,762,767 A | | 6/1998 | Yamada et al. |
| 5,827,110 A | | 10/1998 | Yajima et al. |
| 5,830,272 A | | 11/1998 | Begin et al. |
| 5,885,138 A | | 3/1999 | Okumura et al. |
| 5,897,426 A | | 4/1999 | Somekh |
| 5,919,529 A | | 7/1999 | Matsumura |
| 6,110,011 A | | 8/2000 | Somekh et al. |
| 6,254,760 B1 | | 7/2001 | Shen et al. |

FOREIGN PATENT DOCUMENTS

| EP | 0 773 308 | 5/1997 |
| JP | 06-264251 | 9/1994 |
| JP | 06-265510 | 9/1994 |
| JP | 8066865 | 3/1996 |
| JP | 8150559 | 6/1996 |
| JP | 8187658 | 7/1996 |
| JP | 8187659 | 7/1996 |
| JP | 8187660 | 7/1996 |
| JP | 8243916 | 9/1996 |
| JP | 10163208 | 6/1998 |

* cited by examiner

*Primary Examiner*—Donald R. Valentine
(74) *Attorney, Agent, or Firm*—Wenderoth, Lind & Ponack, L.L.P.

(57) ABSTRACT

A substrate plating apparatus forms an interconnection layer on an interconnection region composed of a fine groove and/or a fine hole defined in a substrate. The substrate plating apparatus includes a plating unit for forming a plated layer on a surface of the substrate including the interconnection region, a chemical mechanical polishing unit for chemically mechanically polishing the substrate to remove the plated layer from the surface of the substrate leaving a portion of the plated layer in the interconnection region, a cleaning unit for cleaning the substrate after the plated layer is formed or the substrate is chemically mechanically polished, a drying unit for drying the substrate after the substrate is cleaned, and a substrate transfer unit for transferring the substrate to and from each of the first plating unit, the first chemical mechanical polishing unit, the cleaning unit, and the drying unit. The first plating unit, the first chemical mechanical polishing unit, the cleaning unit, the drying unit, and the substrate transfer unit are combined into a unitary arrangement.

49 Claims, 15 Drawing Sheets

F I G. 1 0
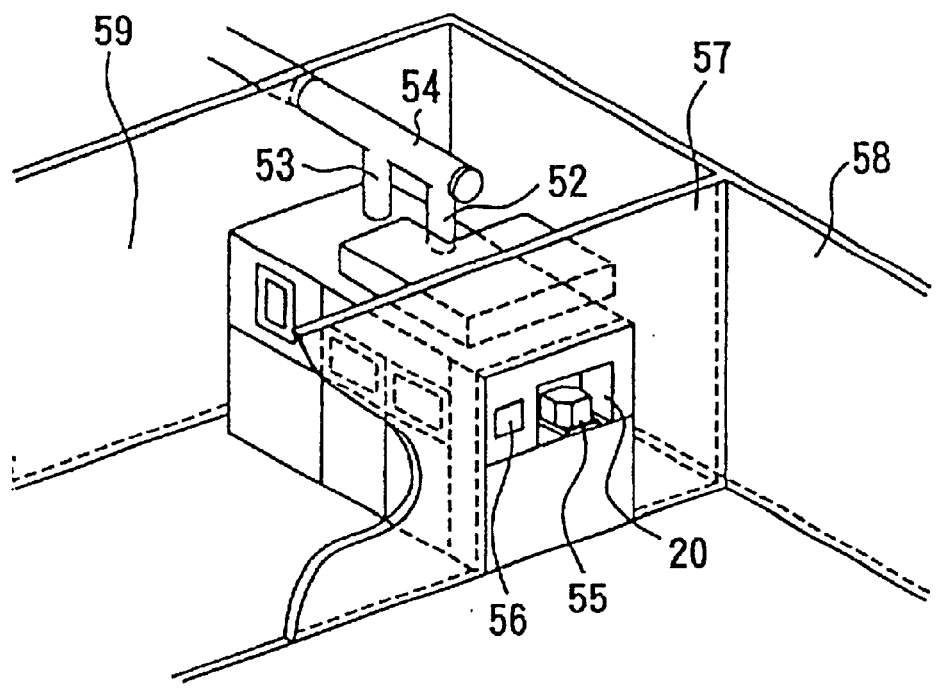

F I G. 12
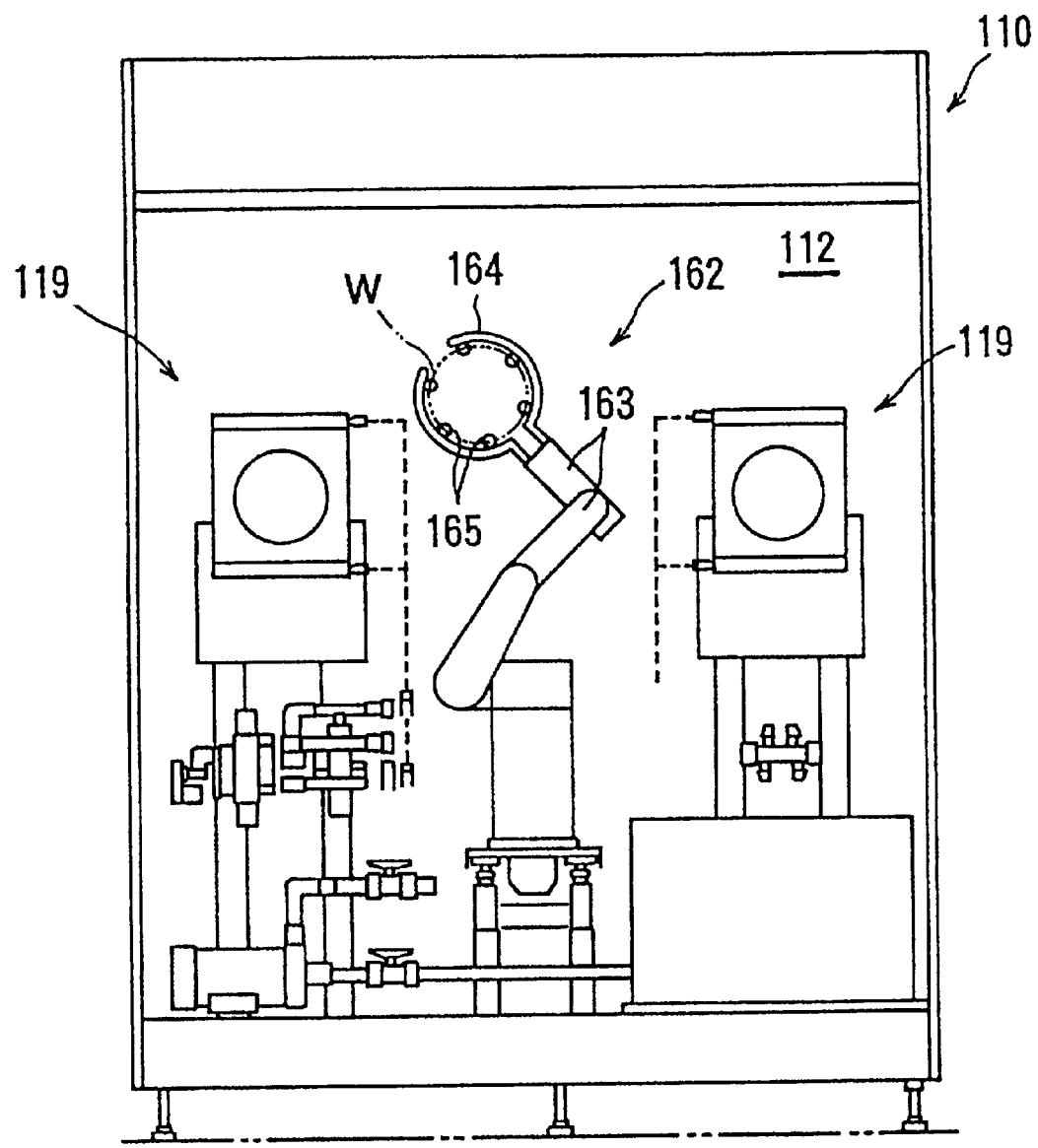

F I G. 1 5
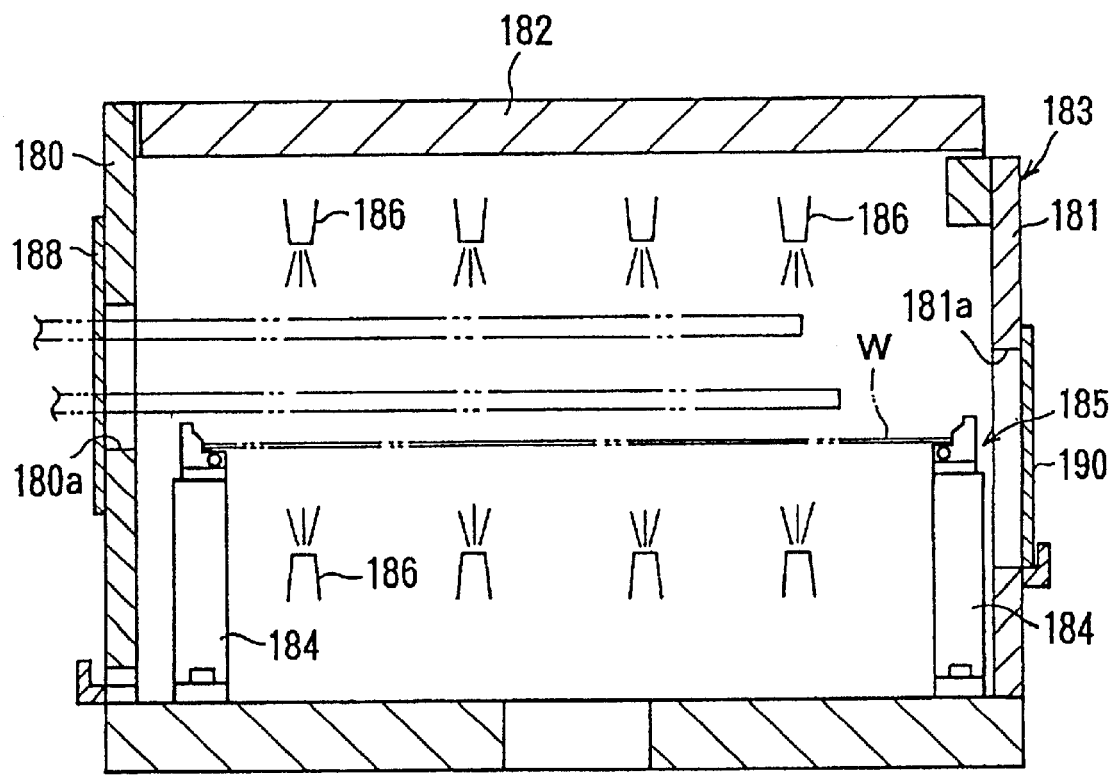

SUBSTRATE PLATING APPARATUS

This application is a divisional of U.S. patent application Ser. No. 09/154,895, filed Sep. 17, 1998, and now U.S. Pat. No. 6,294,059.

BACKGROUND OF THE INVENTION

1. Field of the Invention

The present invention relates to a substrate plating apparatus for plating a substrate, and more particularly to a substrate plating apparatus for forming a metal interconnection layer in an interconnection region composed of a fine groove and/or a fine hole defined in a substrate such as a semiconductor wafer or the like.

2. Description of the Related Art

For forming an interconnection circuit on a semiconductor substrate, it has been customary to deposit a conductive film on a surface of the semiconductor substrate by sputtering or the like, and remove unwanted areas of the conductive film by chemical dry etching using a pattern mask such as a resist or the like.

The material of the interconnection circuit has generally been aluminum (Al) or aluminum alloy. Highly integrated semiconductor circuits have thinner interconnections, which result in increased current densities that are responsible for increased thermal stresses and temperature rises. As aluminum films become thinner due to stress migration or electromigration, these problems manifest themselves to the point where interconnections tend to be broken down or short-circuited.

Thus, there is a greater demand for using conductive materials such as copper (Cu) for forming these interconnections, in order to realize lower conductivity and to avoid electromigrations due to currents flowing therethrough. However, since it is difficult to remove copper or its alloy by dry etching, the conventional process of depositing a copper film and then patterning the copper film by dry etching cannot be relied upon for producing interconnections on substrates. One solution is to form a desired pattern of interconnection grooves in a substrate surface, and then fill the interconnection grooves with copper or its alloy. This process does not require any etching process to remove unwanted copper or its alloy. Instead, surface irregularities or steps are removed from the substrate surface by a polishing process. The process is also advantageous in that interconnection holes for interconnecting vertical circuit layers can also be formed simultaneously.

However, as the width of interconnections becomes thinner, those interconnection grooves or holes have a higher aspect ratio, i.e., a higher ratio of their depth to their diameter or width, and cannot uniformly be filled with copper or its alloy by performing a sputtering operation.

Chemical vapor deposition (CVD) is widely used for forming films of various materials. Nevertheless, the application of CVD to for the formation of films of copper or its alloy is not promising because it is difficult to prepare a suitable gaseous material as a source of copper or its alloy. If an organic material is used, carbon (C) tends to be introduced from the organic material into a deposited film, resulting in greater electrical resistivity.

There has been proposed a plating process for depositing a copper film on a substrate. According to the proposed plating process, a substrate is immersed in a plating solution to plate the substrate with copper, i.e. an electroless plating or electroplating procedure, and then unwanted areas of the plated copper layer is removed by chemical mechanical polishing (CMP). The plating process makes it possible to fill interconnection grooves of high aspect ratios uniformly with a highly conductive copper metal. When the plating process is continuously carried out within a clean atmosphere in a semiconductor fabrication facility, however, chemicals or solutions used in a pretreatment process and the plating process are spread as a chemical mist or gas, which tends to be attached to clean substrates that have been processed in the semiconductor fabrication facility. This problem arises even if the pretreatment process and the plating process are performed in a sealed processing chamber. Specifically, since the sealed processing chamber has to be opened for loading and unloading substrates, the chemical mist or gas generated in the plating bath or pretreatment bath or chamber cannot be prevented from spreading into the semiconductor fabrication facility.

It has been desired to develop a single apparatus or chamber for forming a plated copper layer on a surface of a semiconductor wafer including interconnection regions, which are composed of fine grooves and fine holes, by performing an electroless plating or electroplating operation, and then removing unwanted copper layer portions by performing a chemical mechanical polishing operation, thereby leaving the plated copper layer only in the interconnection regions. However, such a single apparatus or chamber has not been put to practical use.

If a substrate plating apparatus and a chemical mechanical polishing apparatus are separate from each other, then a semiconductor wafer plated with a copper layer has to be dried and unloaded from the substrate plating apparatus, and then a dried semiconductor wafer is loaded into the chemical mechanical polishing apparatus for removing unwanted copper portions. Therefore, two separate drying apparatuses or chambers are necessary. In some applications, a protective plated layer is deposited on a plated copper interconnection layer for protecting its surface. However, since the substrate plating apparatus is separate from the chemical mechanical polishing apparatus, the surface of the protective plated layer tends to be oxidized during the wafer transfer from the substrate plating apparatus to the chemical mechanical polishing apparatus.

The substrate plating apparatus generally comprises a loading and unloading area for transferring cassettes, which store substrates, a plating area for plating substrates, and a cleaning and drying area for cleaning and drying plated substrates. If the substrate plating apparatus, i.e., a wet processing bath which is accommodated in a chamber, is placed in a clean room for semiconductor fabrication facilities, then it is necessary to prevent particles, mists and gasses generated from a plating solution or a cleaning solution from being applied to semiconductor wafers which have already been processed and dried. Stated otherwise, when processed semiconductor wafers are unloaded from the substrate plating apparatus and transferred to a next processing stage, the particles, mists and gasses from the plating solution or the cleaning solution should not be spread into the clean room, where other manufacturing processes are carried out.

SUMMARY OF THE INVENTION

It is therefore an object of the present invention to provide a substrate plating apparatus which is free of the various conventional problems even when placed in a clean room accommodating semiconductor fabrication facilities. A second object of the present invention is to provide a substrate plating apparatus which is capable of performing, with a unitary arrangement, various processing operations including forming a plated layer on a surface of a substrate including interconnection regions composed of fine interconnection grooves and fine interconnection holes, and removing unwanted layer portions from the substrate, thereby leaving the plated layer in the interconnection regions as an interconnection layer on the substrate.

Another object of the present invention is to provide a substrate plating apparatus which is effective to prevent particles, mists and gasses of a plating solution and a cleaning solution from spreading into a clean room as plated semiconductor wafers are transferred in the clean room from the plating apparatus to further processing equipment. These particles, mists and gasses are also prevented from spreading.

According to the present invention, there is provided a substrate plating apparatus for forming an interconnection layer on an interconnection region composed of a fine groove and/or a fine hole defined in a substrate, comprising: a first plating unit for forming a layer on a surface of the substrate including the interconnection region; a first chemical mechanical polishing unit for chemically mechanically polishing the substrate to remove unwanted portions of the layer from the surface of the substrate; a cleaning unit for cleaning the substrate after the layer has been formed or after the substrate has been chemically mechanically polished; a drying unit for drying the substrate after the substrate has been cleaned; and a substrate transfer device for transferring the substrate to and from each of the first plating unit, the first chemical mechanical polishing unit, the cleaning unit, and the drying unit, wherein the first plating unit, the first chemical mechanical polishing unit, the cleaning unit, the drying unit, and the substrate transfer devices are combined into a unitary arrangement.

The substrate plating apparatus may further comprise a second plating unit for forming a protective layer over the first layer in the interconnection region after the unwanted portions have been removed by chemical mechanical polishing from the surface of the substrate, wherein the second plating unit is part of the unitary arrangement.

The substrate plating apparatus may further comprise a second chemical mechanical polishing unit for chemically mechanically polishing the substrate to remove unwanted portions of the protective layer formed over the first layer in the interconnection region, wherein the second chemical mechanical polishing unit is part of the unitary arrangement.

The substrate plating apparatus may further comprise a discharging facility for discharging a cleaning solution used by the cleaning unit to clean the substrate, wherein the discharging facility is part of the unitary arrangement.

The substrate transfer device may comprise a robot having an arm, with the first plating unit, the first chemical mechanical polishing unit, the cleaning unit, and the drying unit being accessible to the arm.

The substrate plating apparatus may further comprise concentration analyzing devices for analyzing the concentrations of components of a plating solution used by the first plating unit to form the first layer, and plating solution preparing devices for preparing a plating solution based on the analyzed concentrations, wherein the concentration analyzing devices and the plating solution preparing devices are part of the unitary arrangement.

Since at least the first plating unit, the first chemical mechanical polishing unit, the cleaning unit, the drying unit, and the substrate transfer device are combined into a unitary arrangement, the substrate plating apparatus offers the following advantages:

1. The steps of forming a first layer on a surface of a semiconductor substrate which includes an interconnection region composed of a fine groove and a fine hole, and removing unwanted portions of the first layer from the surface of the semiconductor substrate, can be carried out without multiple drying steps by the substrate plating apparatus If the first plating unit and the chemical mechanical polishing unit were independent of each other, a plurality of different drying units would be required to dry substrates in association with these units. The substrate plating apparatus of the unitary arrangement does not need such different drying units.

2. Down time can be shortened. For example, a substrate can be chemically mechanically polished immediately after plating by a plating solution bath. Consequently, a first layer is prevented from being naturally oxidized, and particles are prevented from being excessively applied to the first layer between such plating and polishing steps.

There is also provided a substrate plating apparatus for plating a substrate comprising: a loading and unloading area for transferring a cassette which stores a substrate; a plating area for plating a substrate; and a cleaning and drying area for cleaning and drying a plated substrate; wherein the cleaning and drying area is disposed between the loading and unloading area and the plating area, a first partition is disposed between the loading and unloading area and the cleaning and drying area and has a passage defined therein for transferring a substrate between the loading and unloading area and the cleaning and drying area, and a second partition is disposed between the cleaning and drying area and the plating area and has a passage defined therein for transferring a substrate between the cleaning and drying area and the plating area.

The substrate plating apparatus may further comprise a first shutter movably mounted for opening and closing the passage defined in the first partition, and a second shutter movably mounted for opening and closing the passage defined in the second partition.

As described above, the cleaning and drying area is disposed between the loading and unloading area and the plating area. The first partition is disposed between the loading and unloading area and the cleaning and drying area, and the second partition is disposed between the cleaning and drying area and the plating area. Therefore, a substrate loaded in a dry state is plated and cleaned in the substrate plating apparatus and the substrate cleaning apparatus, and unloaded in a dry state from the substrate plating apparatus. Consequently, even if the substrate plating apparatus is installed in a clean room, the clean room is prevented from being contaminated with particles and mists from the plating apparatus and the cleaning apparatus.

When the substrate plating apparatus is installed in a clean room, pressures in the loading and unloading area, the plating area, and the cleaning and drying area are selected such that the pressure in the loading and unloading area is higher than the pressure in the cleaning and drying area, which in turn is higher than the pressure in the plating area, and wherein the pressure in the loading and unloading area is lower than a pressure in the clean room.

Because the pressure in the loading and unloading area is higher than the pressure in the cleaning and drying area, which in turn is higher than the pressure in the plating area, and because the pressure in the loading and unloading area is lower than the pressure in the clean room, air flows in the substrate plating apparatus are prevented from leaking into the clean room, and hence from contaminating the clean room.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 10 is a perspective view of the substrate plating apparatus shown in FIG. 7, which is placed in a clean room;

FIG. 12 is a cross-sectional view taken along line XII—XII of FIG. 11;

FIG. 15 is a cross-sectional view taken along line XV—XV of FIG. 13.

DETAILED DESCRIPTION OF THE PREFERRED EMBODIMENTS

Figure 1:
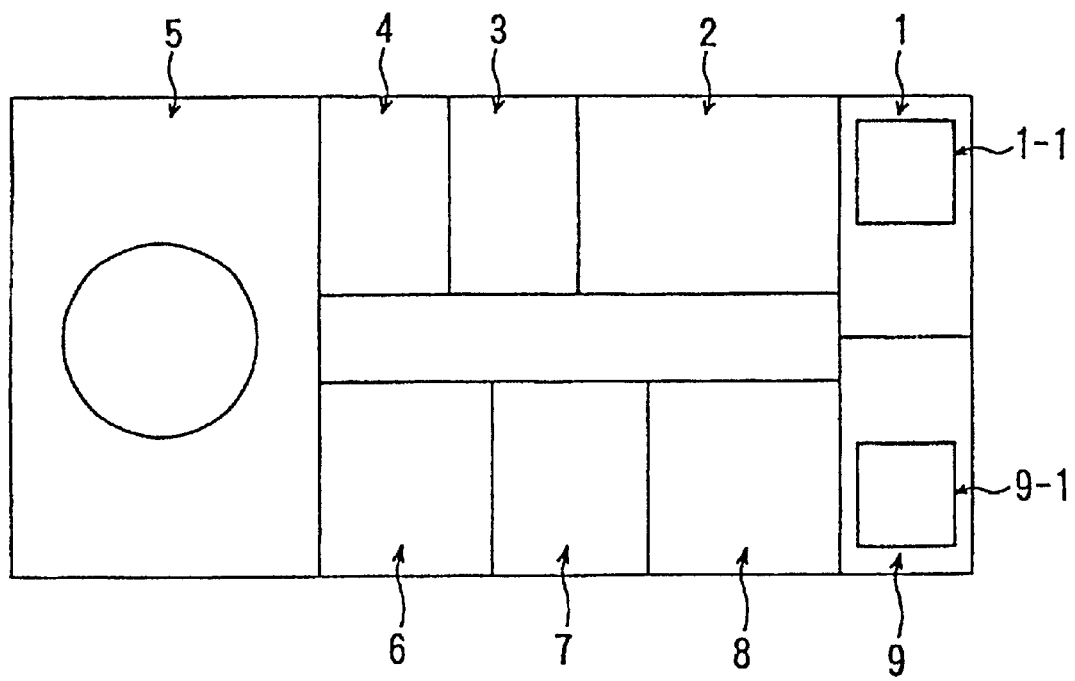
FIG. 1 is a plan view of a substrate plating apparatus for forming interconnections on a semiconductor wafer according to a first embodiment of the present invention.

As shown in FIG. 1, a substrate plating apparatus for forming interconnections on a semiconductor wafer according to a first embodiment of the present invention generally comprises a loading unit 1 for loading a semiconductor wafer, a copper plating chamber 2 for plating a semiconductor wafer with copper, a pair of water cleaning chambers 3, 4 for cleaning a semiconductor wafer with water, a chemical mechanical polishing unit 5 for chemically and mechanically polishing a semiconductor wafer, a pair of water cleaning chambers 6, 7 for cleaning a semiconductor wafer with water, a drying chamber 8 for drying a semiconductor wafer, and an unloading unit 9 for unloading a semiconductor wafer with an interconnection layer thereon. The substrate plating apparatus also has a wafer transfer mechanism (not shown) for transferring semiconductor wafers to the chambers 2, 3, 4, the chemical mechanical polishing unit 5, the chambers 6, 7, 8, and the unloading unit 9. The loading unit 1, the chambers 2, 3, 4, the chemical mechanical polishing unit 5, the chambers 6, 7, 8, and the unloading unit 9 are combined into a unitary arrangement.

Figure 2A:
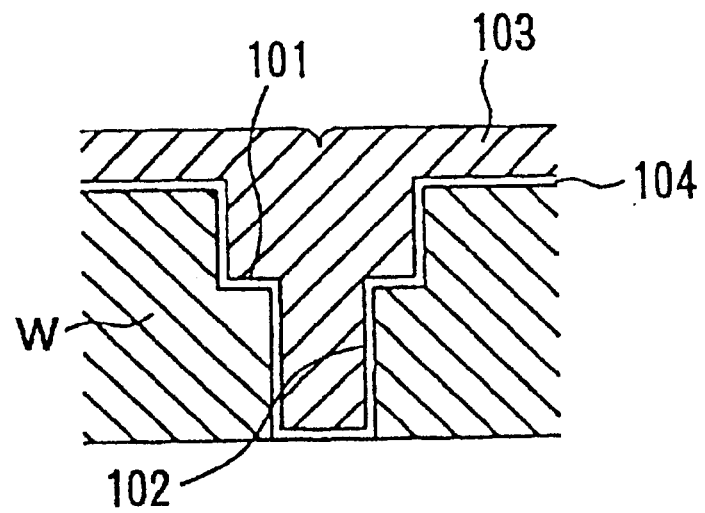
FIGS. 2A and 2B are fragmentary cross-sectional views illustrative of an interconnection plating process carried out by the substrate plating apparatus shown in FIG. 1.

The substrate plating apparatus operates as follows: The wafer transfer mechanism transfers a semiconductor wafer W, on which an interconnection layer has not yet been formed, from a wafer cassette 1-1 placed in the loading unit 1 to the copper plating chamber 2. In the copper plating chamber 2, as shown in FIG. 2A, a copper layer 103 is formed on a surface of the semiconductor wafer W having an interconnection region composed of an interconnection groove 101 and an interconnection hole (contact hole) 102.

Figure 2B:
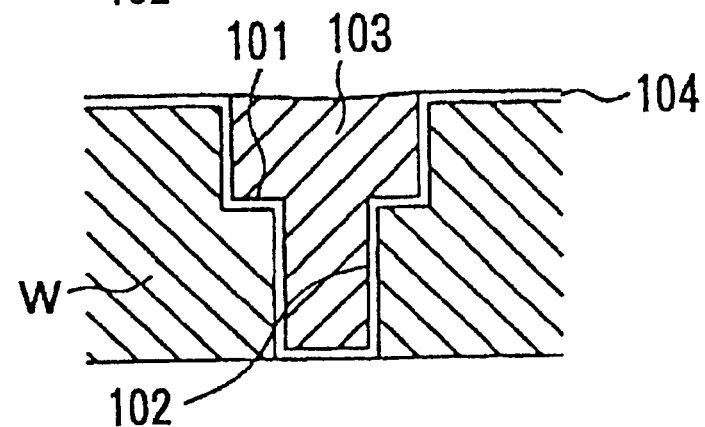

After the copper layer 103 is formed on the semiconductor wafer W in the copper plating chamber 2, the semiconductor wafer W is transferred to the water cleaning chambers 3, 4 by the wafer transfer mechanism, and cleaned by water in the water cleaning chambers 3, 4. The cleaned semiconductor wafer W is transferred to the chemical mechanical polishing unit 5 by the wafer transfer mechanism. As shown in FIG. 2B, the chemical mechanical polishing unit 5 removes unwanted portions of the copper layer 103 from the surface of the semiconductor wafer W, thereby leaving a portion of the plated copper layer 103 in the interconnection groove 101 and the interconnection hole 102. In FIGS. 2A and 2B, a barrier layer 104 made of tin or the like is formed on the surface of the semiconductor wafer W, including the inner surfaces of the interconnection groove 101 and the interconnection hole 102, before the copper layer 103 is deposited.

Then, the semiconductor wafer W with the remaining copper layer 103 is transferred to the water cleaning chambers 6, 7 by the wafer transfer mechanism, and cleaned by water in the water cleaning chambers 6, 7. The cleaned semiconductor wafer W is then dried in the drying chamber 8, after which the dried semiconductor wafer W with the remaining copper layer 103, serving as an interconnection layer, is placed into a wafer, cassette 9-1 in the unloading unit 9.

Figure 3:
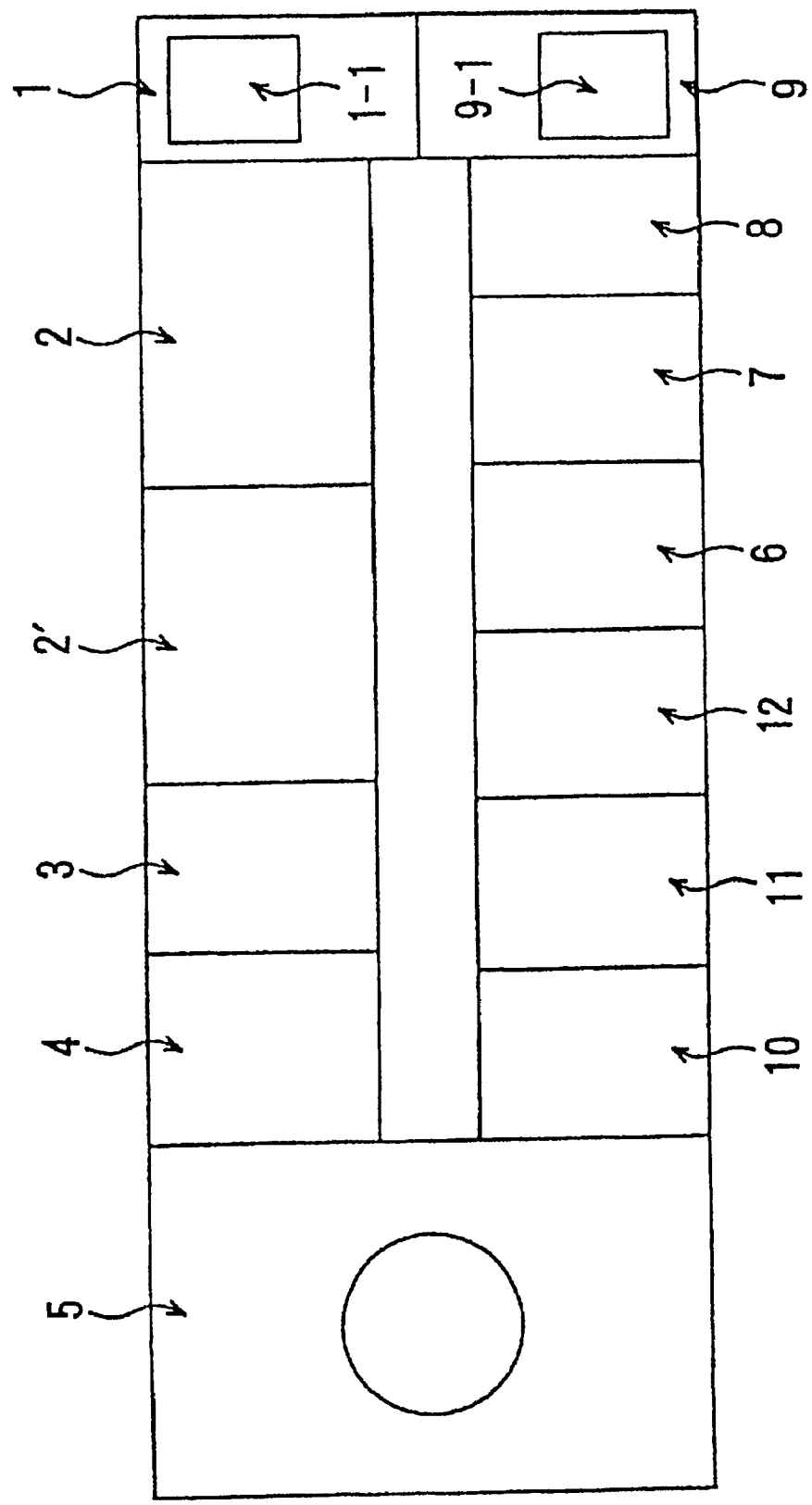
FIG. 3 is a plan view of a substrate plating apparatus for forming interconnections on a semiconductor wafer according to a second embodiment of the present invention.

FIG. 3 shows in plan a substrate plating apparatus for forming interconnections on a semiconductor wafer according to a second embodiment of the present invention. The substrate plating apparatus shown in FIG. 3 differs from the substrate plating apparatus shown in FIG. 1 in that it additionally includes a copper plating chamber 2', a water cleaning chamber 10, a pretreatment chamber 11, and a protective layer plating chamber 12 for forming a protective layer on a copper layer on a semiconductor wafer. The loading unit 1, the chambers 2, 2', 3, 4, the chemical mechanical polishing unit 5, the chambers 6, 7, 8, 10, 11, 12, and the unloading unit 9 are combined into a unitary arrangement. Those parts shown in FIGS. 3 and 4A through 4D which are identical to those shown in FIGS. 1 and 2A, 2B are denoted by identical reference numerals, and will not be described in detail below.

Figure 4A:
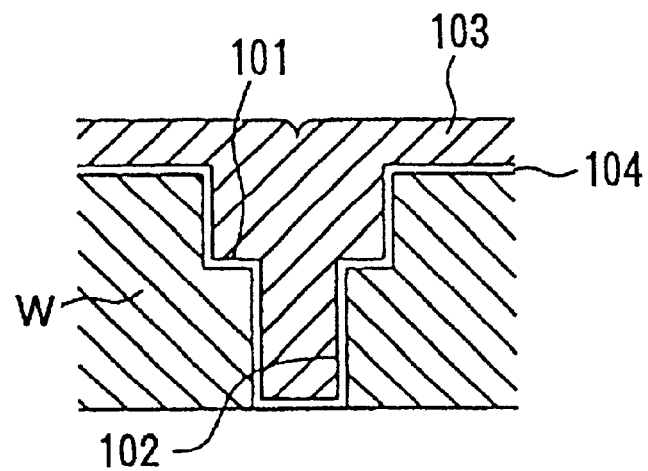
FIGS. 4A through 4D are fragmentary cross-sectional views illustrative of an interconnection plating process carried out by the substrate plating apparatus shown in FIG. 3.

The substrate plating apparatus shown in FIG. 3 operates as follows: A semiconductor wafer W is supplied from the wafer cassette 1-1, placed in the loading unit 1, successively to the copper plating chambers 2, 2'. In the copper plating chamber 2, 2', as shown in FIG. 4A, a copper layer 103 is formed on a surface of a semiconductor wafer W having an interconnection region composed of an interconnection groove 101 and an interconnection hole (contact hole) 102. The two copper plating chambers 2-, 2' are employed to allow the semiconductor wafer W to be plated with a copper layer for a long period of time. Specifically, the semiconductor wafer W may be plated with a primary copper layer by electroplating in the copper plating chamber 2, and then plated with a secondary copper layer by electroless plating in the copper plating chamber 2'. The substrate plating apparatus may have more than two copper plating chambers.

Figure 4B:
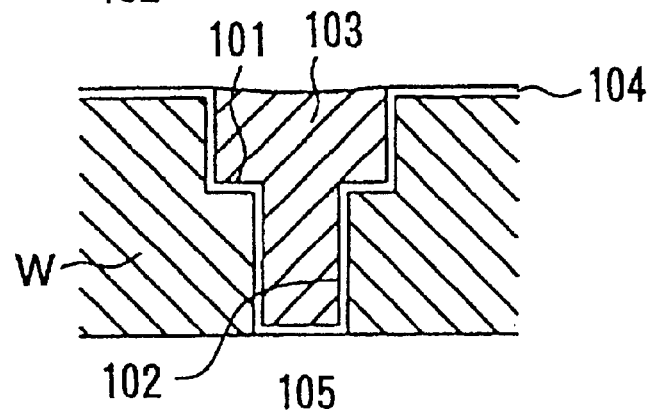

The semiconductor wafer W with the copper layer 103 formed thereon is cleaned by water in the water cleaning chambers 3, 4. Then, as shown in FIG. 4B, the chemical mechanical polishing unit 5 removes unwanted portions of the copper layer 103 from the surface of the semiconductor wafer W, thereby leaving a portion of the copper layer 103 in the interconnection groove 101 and the interconnection hole 102.

Figure 4C:
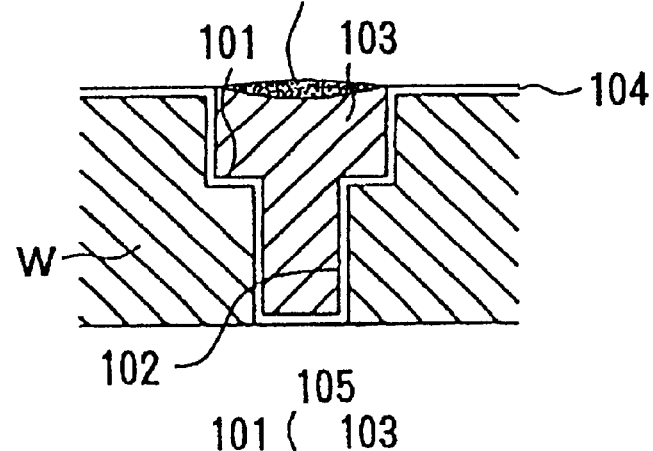

Thereafter, the semiconductor wafer W with the remaining copper layer 103 is transferred to the water cleaning chamber 10, in which the semiconductor wafer W is cleaned with water. Then, the semiconductor wafer W is transferred to the pretreatment chamber 11, and pretreated therein for the deposition of a protective layer. The pretreated semiconductor wafer W is transferred to the protective layer-plating chamber 12. In the protective layer plating chamber 12, as shown in FIG. 4C, a protective layer 105 is formed on the copper layer 103 in the interconnection region on the semiconductor wafer W. For example, the protective layer 105 is formed with an alloy of nickel (Ni) and boron (B) by electroless plating. After the protective layer 105 is deposited, the semiconductor wafer W is cleaned by water in the water cleaning chambers 6, 7, dried in the drying chamber 8, and then transferred to the wafer cassette 9-1 in the unloading unit 9.

Figure 5:
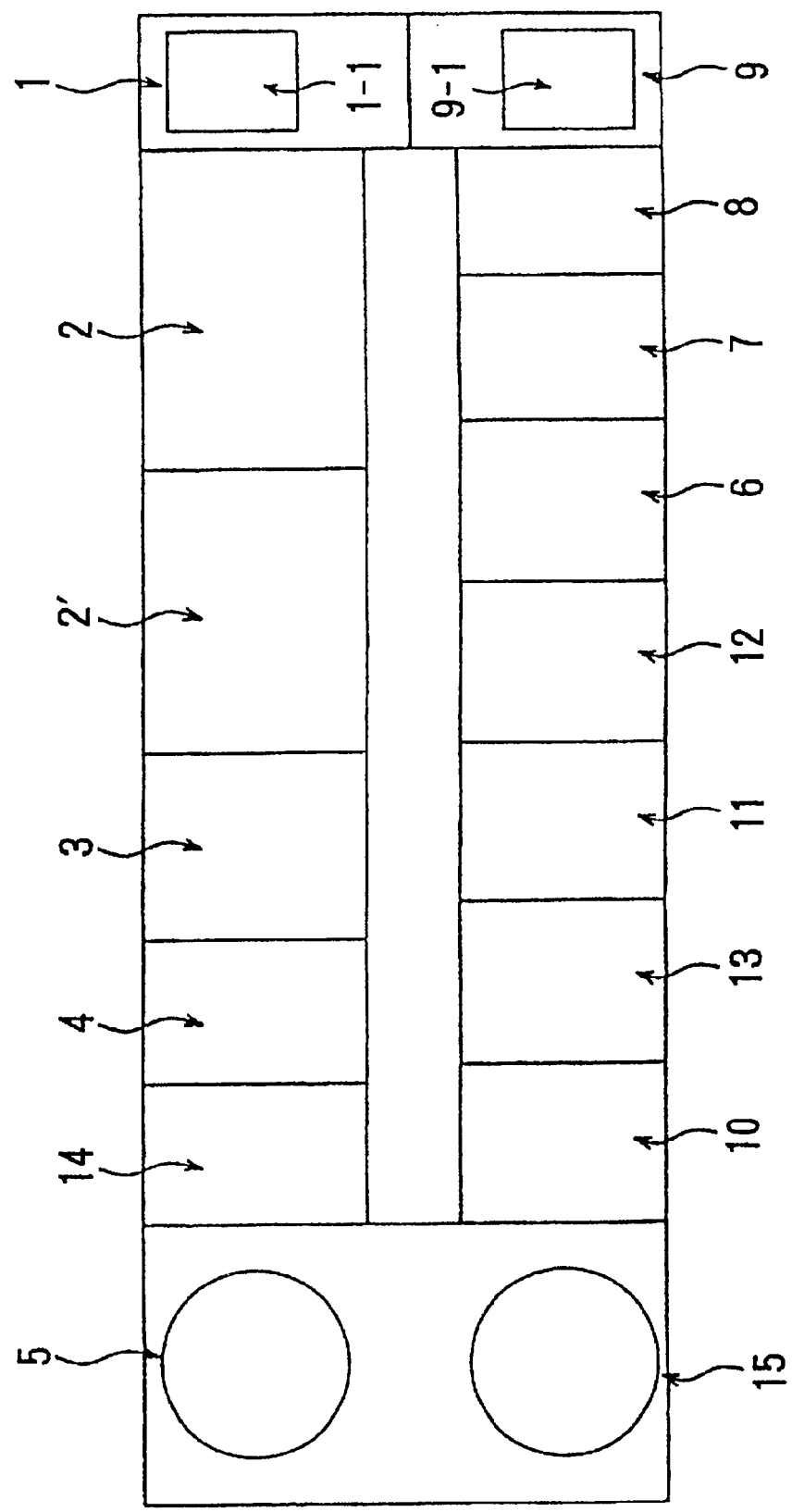
FIG. 5 is a plan view of a substrate plating apparatus for forming interconnections on a semiconductor wafer according to a third embodiment of the present invention.

FIG. 5 shows in plan a substrate plating apparatus for forming interconnections on a semiconductor wafer according to a third embodiment of the present invention. The substrate plating apparatus shown in FIG. 5 differs from the substrate plating apparatus shown in FIG. 3 in that it additionally includes a chemical mechanical polishing unit 15, and water cleaning chambers 13, 14. The loading unit 1, the chambers 2, 2', 3, 4, 14, the chemical mechanical polishing unit 5, 15, the chambers 6, 7, 8, 10, 11, 12, 13, and the unloading unit 9 are combined into a unitary arrangement. Those parts shown in FIG. 5 which are identical to those shown in FIG. 3 are denoted by identical reference numerals, and will not be described in detail below.

Figure 4D:
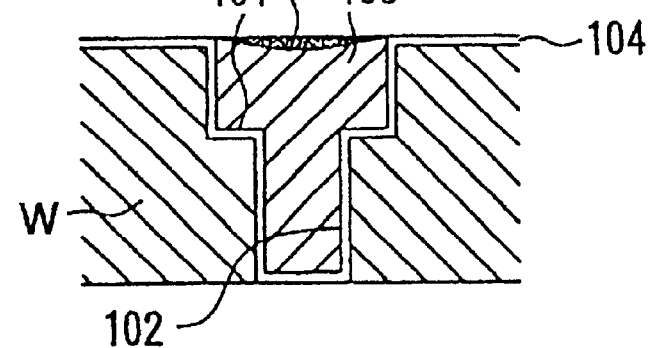

In the chemical mechanical polishing unit 15, an upper portion of the protective layer 105 deposited on the copper layer 103 is polished off to planarize the protective layer 105, as shown in FIG. 4D. The water cleaning chambers 13, 14 additionally clean the semiconductor wafer W with water.

Figure 6:
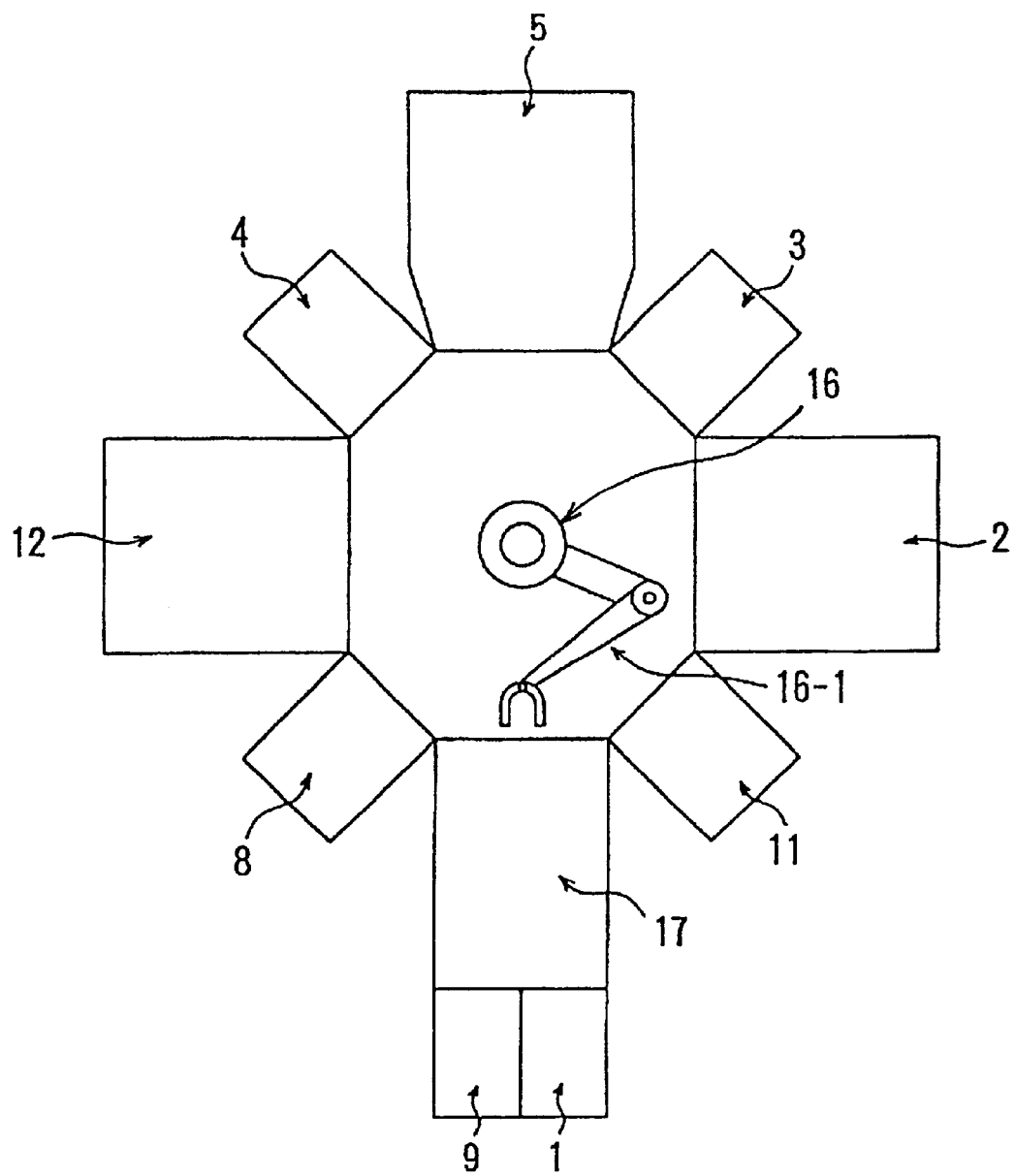
FIG. 6 is a plan view of a substrate plating apparatus for forming interconnections on a semiconductor wafer according to a fourth embodiment of the present invention.

FIG. 6 shows in plan a substrate plating apparatus for forming interconnections on a semiconductor wafer according to a fourth embodiment of the present invention. As shown in FIG. 6, the substrate plating apparatus includes a robot 16 at its center which has a robot arm 16-1, and also has a copper plating chamber 2, a pair of water cleaning chambers 3, 4 a chemical mechanical polishing unit 5, a pretreatment chamber 11, a protective layer plating chamber 12, a drying chamber 8, and a loading and unloading station 17, which are disposed around the robot 16 and positioned within the reach of the robot arm 16-1. A loading unit 1 for loading semiconductor wafers and an unloading unit 9 for unloading semiconductor wafers is disposed adjacent to the loading and unloading station 17. The robot 16, the chambers 2, 3, 4, the chemical mechanical polishing unit 5, the chambers 8, 11, 12, the loading and unloading station 17, the loading unit 1, and the unloading unit 9 are combined into a unitary arrangement The substrate plating apparatus shown in FIG. 6 operates as follows:

A semiconductor wafer to be plated is transferred from the loading unit 1 to the loading and unloading station 17, from which the semiconductor wafer is received by the robot arm 16-1 and transferred thereby to the copper plating chamber 2. In the copper plating chamber 2, as shown in FIG. 4A, a copper layer 103 is formed on a surface of the semiconductor wafer which has an interconnection region composed of an interconnection groove 101 and an interconnection hole 102. The semiconductor wafer with the copper layer 103 formed thereon is transferred by the robot arm 16-1 to the chemical mechanical polishing unit 5. In the chemical mechanical polishing unit 5, as shown in FIG. 4B, unwanted portions of the copper layer 103 are removed from the surface of the semiconductor wafer W, thereby leaving a portion of the copper layer 103 in the interconnection groove 101 and the interconnection hole 102.

The semiconductor wafer is then transferred by the robot arm 16-1 to the water-cleaning chamber 4, in which the semiconductor wafer is cleaned by water. Thereafter, the semiconductor wafer is transferred by the robot arm 16-1 to the pretreatment chamber 11, in which the semiconductor wafer is pretreated therein for the deposition of a protective layer. The pretreated semiconductor wafer is transferred by the robot arm 16-1 to the protective layer plating chamber 12. In the protective layer plating chamber 12, a protective layer 105 is formed on the copper layer 103 in the interconnection region on the semiconductor wafer W, as shown in FIG. 4C. The semiconductor wafer with the protective layer 105 formed thereon is transferred by the robot arm 16-1 to the water cleaning chamber 4, in which the semiconductor wafer is cleaned by water. The cleaned semiconductor wafer is transferred by the robot arm 16-1 to the drying chamber 8, in which the semiconductor wafer is dried. The dried semiconductor wafer is transferred by the robot arm 16-1 to the loading and unloading station 17, from which the plated semiconductor wafer is transferred to the unloading unit 9.

If the copper plating chambers 2, 2' of the substrate plating apparatus shown in FIGS. 1, 3, 5, 6 are copper electroplating chambers, then the substrate plating apparatus may have a copper ion concentration analyzer, an oxygen concentration analyzer, a plating additive concentration analyzer, and a plating solution preparing unit for preparing a plating solution based on analyzed results from the analyzers. These analyzers and the plating solution preparing unit may be integrally combined with the other components of the substrate plating apparatus into a unitary arrangement. The substrate plating apparatus may have only some of the above analyzers, rather than all of them.

If the copper plating chambers 2, 2' are copper electroless plating chambers, then the substrate plating apparatus may have a copper ion concentration analyzer, an oxidizing agent concentration analyzer, a reducing agent concentration analyzer, and a pH measuring unit, along with a plating solution preparing unit for preparing a plating solution based on analyzed results from the analyzers and a pH measured by the pH measuring unit. These analyzers, the pH-measuring unit, and the plating solution preparing unit may be integrally combined with the other components of the substrate plating apparatus into a unitary arrangement. The substrate plating apparatus may have only some of the above analyzers and the pH measuring unit, rather than all of them.

If the protective layer plating chamber 12 is an Ni—B electroless plating chamber, then the substrate plating apparatus may have a nickel ion concentration analyzer, an oxidizing agent concentration analyzer, a reducing agent concentration analyzer, and a pH measuring unit, along with a plating solution preparing unit for preparing a plating solution based on analyzed results from the analyzers and a pH measured by the pH measuring unit. These analyzers, the pH-measuring unit, and the plating solution preparing unit may be integrally combined with the other components of the substrate plating apparatus into a unitary arrangement. The substrate plating apparatus may have only some of the above analyzers and the pH measuring unit, rather than all of them.

The substrate plating apparatus may have an ion-exchange tower for ion recovery, an activated carbon extraction tower for organic material recovery, a scrubber for processing exhaust gasses, and a solidifier for solidifying and discarding discharged liquids. The towers, the scrubber, and the solidifier may be integrally combined with the other components of the substrate plating apparatus into a unitary arrangement.

The numbers of the plating chambers, water cleaning chambers, and the pretreatment chambers in the substrate plating apparatus shown in FIGS. 1, 3, 5, 6 are illustrative only, and these chambers are not limited to the illustrated numbers.

The chemical mechanical polishing unit may be associated with a slurry supply unit, a discharged liquid processing unit, and a constant-temperature chamber, which may be integrally combined with the chemical mechanical polishing unit into a unitary arrangement.

If any one of the illustrated substrate plating apparatus is installed in a clean room, then it is necessary that processed and dried semiconductor wafers be unloaded and transferred to a next process without exposure to mists, particles of; the plating solution or the cleaning solution contained in the apparatus. Therefore, particles and mists in a plating area and a cleaning and drying area of the substrate plating apparatus should not be applied to processed and dried semiconductor wafers that are stored in a cassette placed in an unloading area of the substrate plating apparatus.

Figure 7:
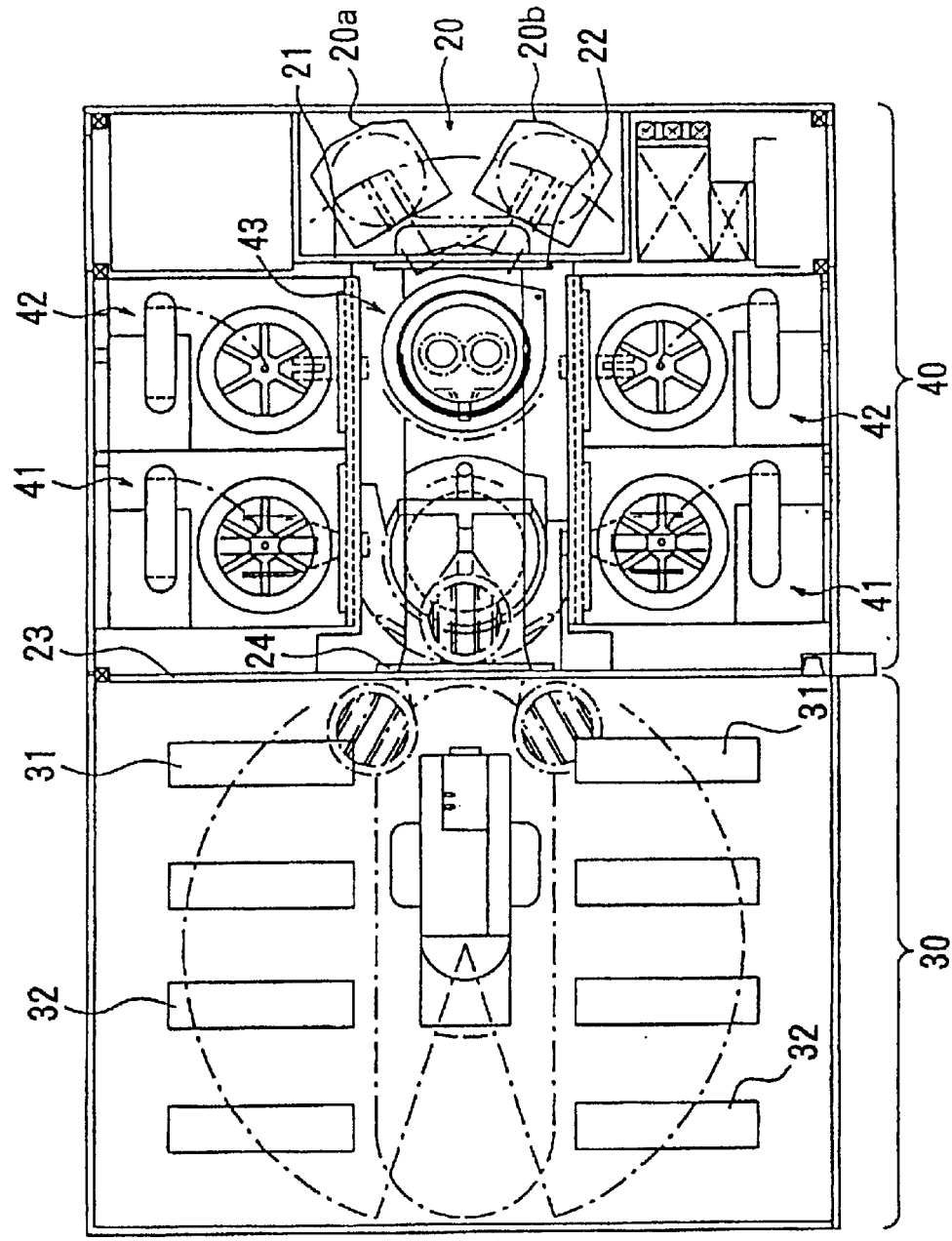
FIG. 7 is a plan view of a substrate plating apparatus for forming interconnections on a semiconductor wafer according to a fifth embodiment of the present invention.

FIG. 7 shows in plan a substrate plating apparatus for forming interconnections on a semiconductor wafer according to a fifth embodiment of the present invention. The substrate plating apparatus shown in FIG. 7 generally comprises a loading and unloading area 20 for transferring wafer cassettes which store semiconductor wafers, a plating area 30 for plating semiconductor wafers, and a cleaning and drying area 40 for cleaning and drying plated semiconductor wafers. The cleaning and drying area 40 is positioned between the loading and unloading area 20 and the plating area 30. A partition 21 is disposed between the loading and unloading area 20 and the cleaning and drying area 40, and a partition 23 is disposed between the cleaning and drying area 40 and the plating area 30.

The partition 21 has a passage (not shown) defined therein for transferring semiconductor wafers therethrough between the loading and unloading area 20 and the cleaning and drying area 40, and supports a shutter 22 for opening and closing the passage. The partition 23 has a passage (not shown) defined therein for transferring semiconductor wafers therethrough between the cleaning and drying area 40 and the plating area 30, and supports a shutter 24 for opening and closing the passage. The cleaning and drying area 40 and the plating area 30 can independently be supplied with and discharge air.

The substrate plating apparatus shown in FIG. 7 is placed in a clean room, which accommodates semiconductor fabrication facilities. The pressures in the loading and unloading area 20, the plating area 30, and the cleaning and drying area 40 are selected as follows:

The pressure in the loading and unloading area 20 is greater than the pressure in the cleaning and drying area 40 which in turn is greater than the pressure in the plating area 30.

The pressure in the loading and unloading area 20 is lower than the pressure in the clean room. Therefore, air does not flow from the plating area 30 into the cleaning and drying area 40, and air does not flow from the cleaning and drying area 40 into the loading and unloading area 20. Furthermore, air does not flow from the loading and unloading area 20 into the clean room.

The loading and unloading area 20 houses a loading unit 20a and an unloading unit 20b, each accommodating a wafer cassette for storing semiconductor wafers. The cleaning and drying area 40 houses two water cleaning units 41 for cleaning plated semiconductor wafers with water, and two drying units 42 for drying plated semiconductor wafers. Each of the water cleaning units 41 may comprise a pencil-shaped cleaner with a sponge layer mounted on a front end thereof, or a roller with a sponge layer mounted on an outer circumferential surf ace thereof. Each of the drying units 42 may comprise a drier for spinning a semiconductor wafer at a high speed to dehydrate and dry it. The cleaning and drying area 40 also has a transfer unit (transfer robot) 43 for transferring semiconductor wafers.

The plating area 30 houses a plurality of pretreatment chambers 31 for pretreating semiconductor wafers prior to being plated, and a plurality of plating chambers 32 for plating semiconductor wafers with copper. Each of the pretreatment chambers 31 contains a pretreatment solution bath including sulfuric acid. A semiconductor wafer can be pretreated when it is immersed in the pretreatment solution bath in the pretreatment chamber 31. Each of the plating chambers 32 contains a plating solution bath including copper sulfate. A semiconductor wafer can be plated with copper when it is immersed in the plating solution bath in the plating chamber 32. The plating area 30 also has a transfer unit (transfer robot) for transferring semiconductor wafers.

Figure 8:
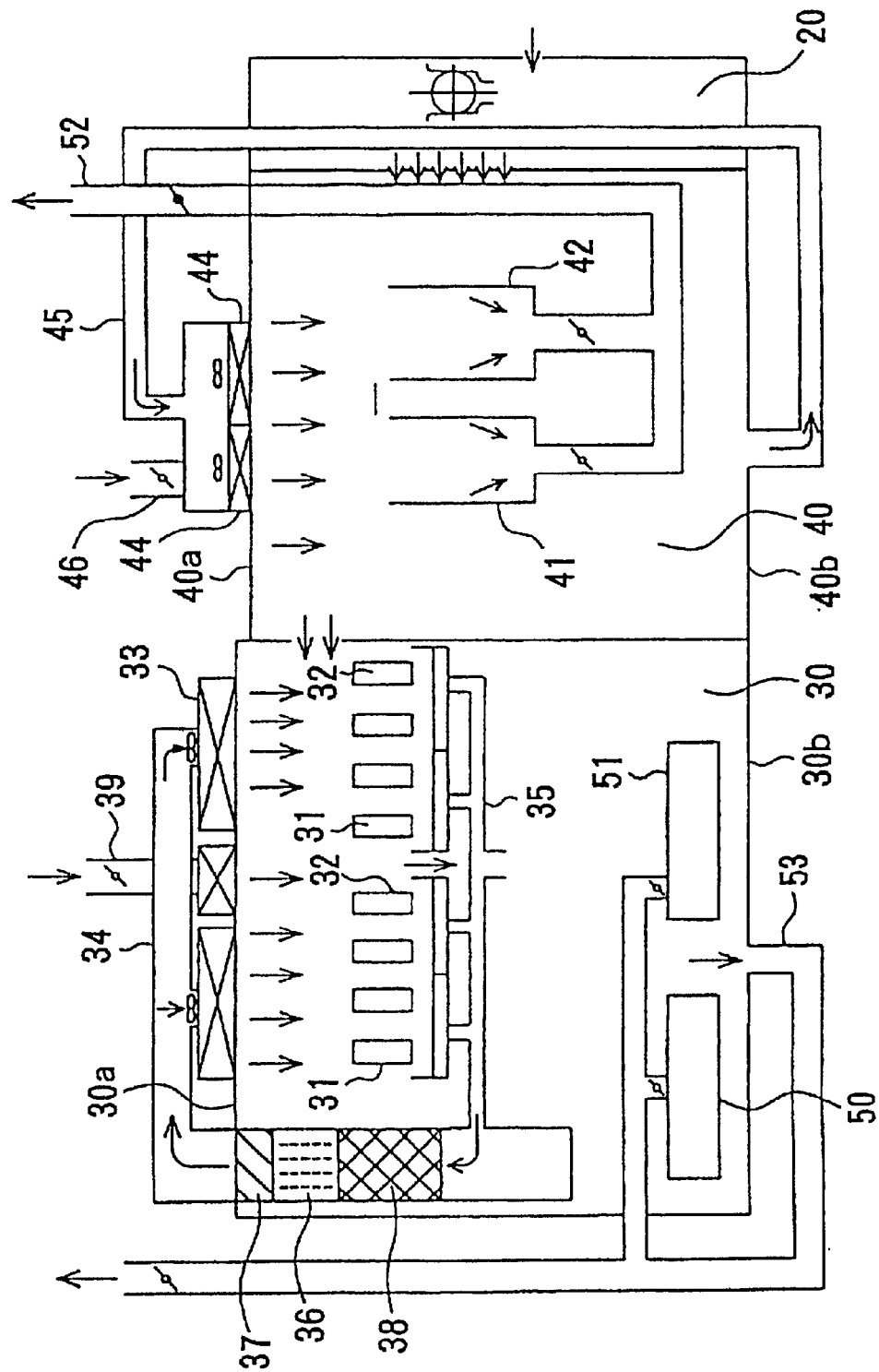
FIG. 8 is a schematic view showing airflow in the substrate plating apparatus shown in FIG. 7.

FIG. 8 shows in side elevation air flows in the substrate plating apparatus. As shown in FIG. 8, fresh air is introduced from the exterior through a duct 46 and forced through high-performance filters 44 by fans from a ceiling 40a into the cleaning and drying area 40 as downward clean air flows around the water cleaning units 41 and the drying units 42. Most of the supplied clean air is returned from a floor 40b through a circulation duct 45 to the ceiling 40a, from which the clean air is forced again through the filters 44 by the fans into the cleaning and drying area 40. Part of the clean air is discharged from the water cleaning units 41 and the drying units 42 through a duct 52 out of the cleaning and drying area 40.

In the plating area 30 which accommodates the pretreatment chambers 31 and the plating chambers 32, particles are not allowed to be applied to the surfaces of semiconductor wafers even though the plating area 30 is a wet zone. To prevent particles from being applied to semiconductor wafers, downward clean air flows around the pretreatment chambers 31 and the plating chambers 32. Fresh air is introduced from the exterior through a duct 39 and forced through high-performance filters 33 by fans from a ceiling 30a into the plating area 30.

If the entire amount of clean air as downward clean air flows introduced into the plating area 30 were always supplied from the exterior, then a large amount of air would be required to be introduced into and discharged from the plating area 30 at all times. According to this embodiment, air is discharged from the plating area 30 through a duct 53 at a rate sufficient to keep the pressure in the plating area 30 lower than the pressure in the cleaning and drying area 40, and most of the downward clean air introduced into the plating area 30 is circulated through circulation ducts 34, 35. The circulation duct 34 extends from the cleaning and drying area 40 and is connected to the filters 33 over the ceiling 30a. The circulation duct 35 is disposed in the cleaning and drying area 40 and connected to the pipe 34 in the cleaning and drying area 40.

The circulating air that has passed around the pretreatment chambers 31 and the plating chambers 32 contains a chemical mist and gasses from solution bathes. The chemical mist and gasses are removed from the circulating air by a scrubber 36 and mist separators 37, 38 which are disposed in the pipe 34 that is connected to the pipe 35. The air which circulates from the cleaning and drying area 40 through the scrubber 36 and the mist separators 37, 38 back into the circulation duct 34 over the ceiling 30a is free of any chemical mist and gasses. The clean air is then forced through the filters 33 by the fans to circulate back into the plating area 30.

Part of the air is discharged from the plating area 30 through the duct 53 connected to a floor 30b of the plating area 30. Air containing a chemical mist and gasses is also discharged from a plating solution circulating tank 50 and an $H_2SO_4$ circulating tank 51 in the plating area 30, through the duct 53. An amount of fresh air which is commensurate with the amount of air discharged through the duct 53 is supplied from the duct 39 into the plating chamber 30 under the negative pressure developed therein with respect to the pressure in the clean room.

Figure 9:
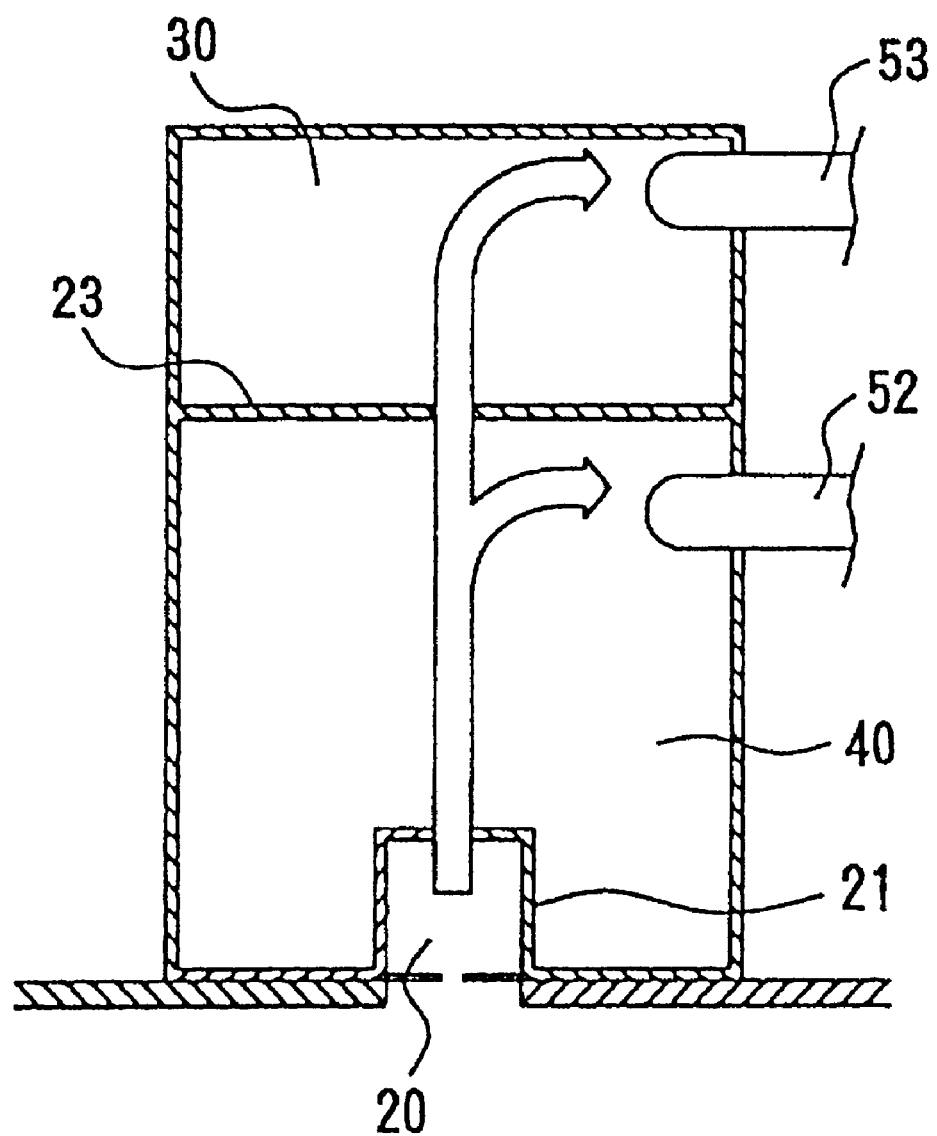
FIG. 9 is a cross-sectional view showing airflows among areas in the substrate plating apparatus shown in FIG. 7.

As described above, the pressure in the loading and unloading area 20 is higher than the pressure in the cleaning and drying area 40 which is higher than the pressure in the plating area 30. When the shutters 22, 24 (see FIG. 7) are opened, therefore, air flows successively through the loading and unloading area 20, the cleaning and drying area 40, and the plating area 30, as shown in FIG. 9. Air discharged from the cleaning and drying area 40 and the plating area 30 flows through the ducts 52, 53 into a common duct 54 (see FIG. 10) which extends out of the clean room.

FIG. 10 shows in perspective the substrate plating apparatus shown in FIG. 7, which is placed in the clean room. The loading and unloading area 20 includes a side wall which has a cassette transfer port 55 defined therein and a control panel 56, and which is exposed to a working zone 58 that is compartmented in the clean room by a partition wall 57. The partition wall 57 also compartments a utility zone 59 in the clean room in which the substrate plating apparatus is installed. Other sidewalls of the substrate plating apparatus are exposed to the utility zone 59 whose air cleanliness is lower than the air cleanliness in the working zone 58.

As described above, the cleaning and drying area 40 is disposed between the loading and unloading area 20 and the plating area 30. The partition 21 is disposed between the loading and unloading area 20 and the cleaning and drying area 40, and the partition 23 is disposed between the cleaning and drying area 40 and the plating area 30. A dry semiconductor wafer is loaded from the working zone 58 through the cassette transfer port 55 into the substrate plating apparatus, and then plated in the substrate plating apparatus. The plated semiconductor wafer is cleaned and dried, and then unloaded from the substrate plating apparatus through the cassette transfer port 55 into the working zone 58. Consequently, no particles and mist are applied to the surface of the semiconductor wafer, and the working zone 58 which has higher air cleanliness than the utility zone 57 is prevented from being contaminated by particles, chemical mists, and cleaning solution mists.

In the fifth embodiment shown in FIGS. 7 and 8, the substrate plating apparatus has the loading and unloading area 20, the cleaning and drying area 40, and the plating area 30. However, an area accommodating a chemical mechanical polishing unit may be disposed in or adjacent to the plating area 30, and the cleaning and drying area 40 may be disposed in the plating area 30 or between the area accommodating the chemical mechanical polishing unit and the loading and unloading area 20. Any of various other suitable area and unit layouts may be employed insofar as a dry semiconductor wafer can be loaded into the substrate plating apparatus, and a plated semiconductor wafer can be cleaned and dried, and thereafter unloaded from the substrate plating apparatus.

FIGS. 11 through 15 show a substrate plating apparatus for forming interconnections on a semiconductor wafer according to a sixth embodiment of the present invention.

Figure 11:
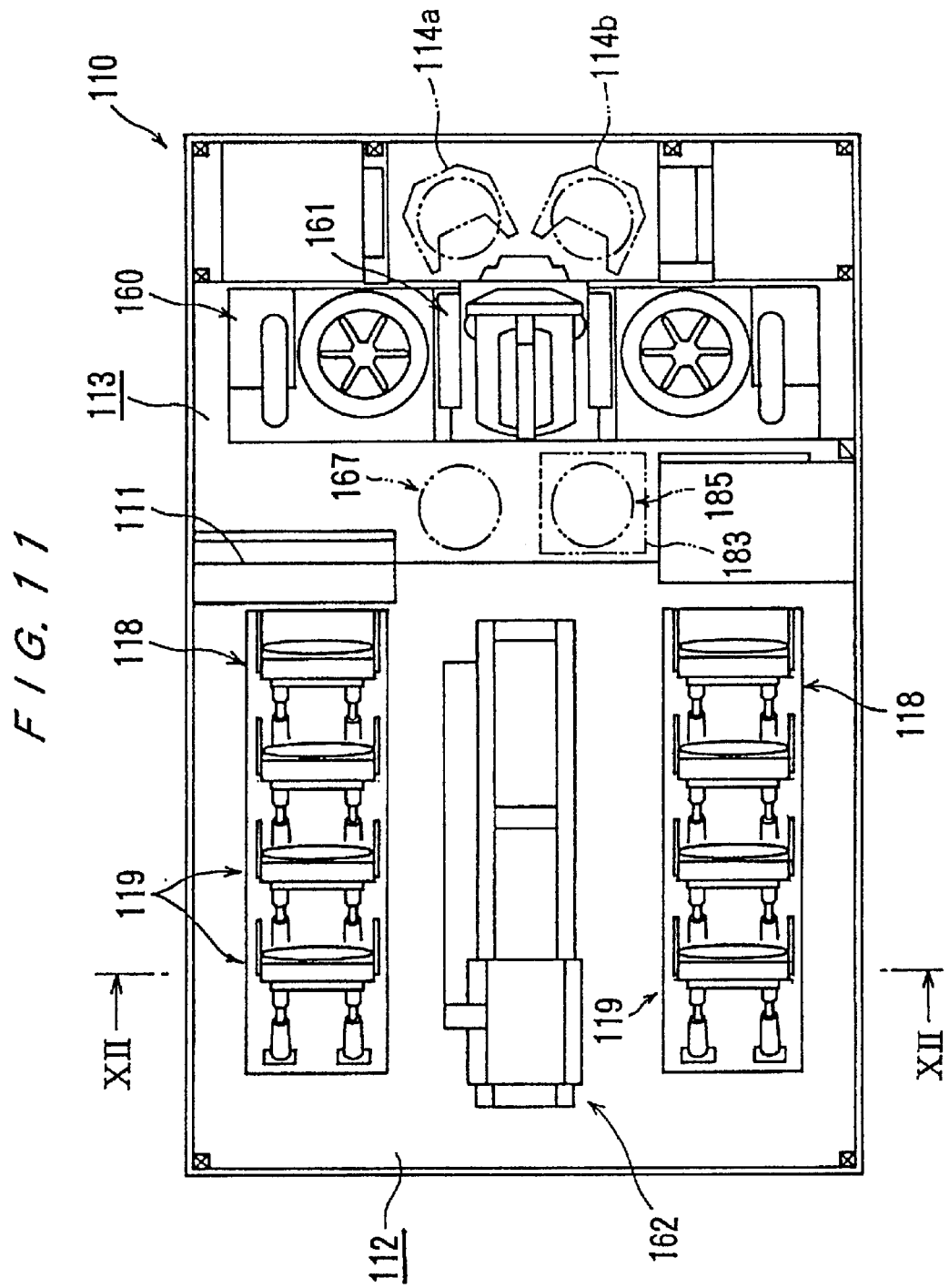
FIG. 11 is a plan view of a substrate plating apparatus for forming interconnections on a semiconductor wafer according to a sixth embodiment of the present invention.

As shown in FIG. 11, the substrate plating apparatus, generally denoted by 110, has a contaminated zone 112 and a clean zone 113 divided by a partition 111. The contaminated zone 112 and the clean zone 113 can independently be supplied with and discharge air. The pressure in the clean zone 113 is higher than the pressure in the contaminated zone 112.

The clean zone 113 accommodates a loading unit 114a, an unloading unit 114b, two water cleaning and drying units 160 for cleaning and drying plated semiconductor wafers, and a transfer unit (transfer robot) 161 for transferring semiconductor wafers. The contaminated zone 112 accommodates two pretreatment chambers 118 for pretreating semiconductor wafers by pretreating solution baths, a plurality of plating chambers 119 for plating semiconductor wafers with copper by plating solution baths, and a transfer unit (transfer robot) 162 for transferring semiconductor wafers.

The pretreatment chambers 118 and the plating chambers 119 are similar in structure and operation to those according the previous embodiments.

As shown in FIG. 12, the transfer unit 162 disposed in the contaminated zone 112 comprises a six-axis robot, for example, having a plurality of interconnected arms 163 with an openable and closable grip hand 164 mounted on a tip end of the arms 163. The grip hand 164 is in the form of a ring having a plurality of rotatable rollers 165 mounted on an inner circumferential surface thereof.

Figure 13:
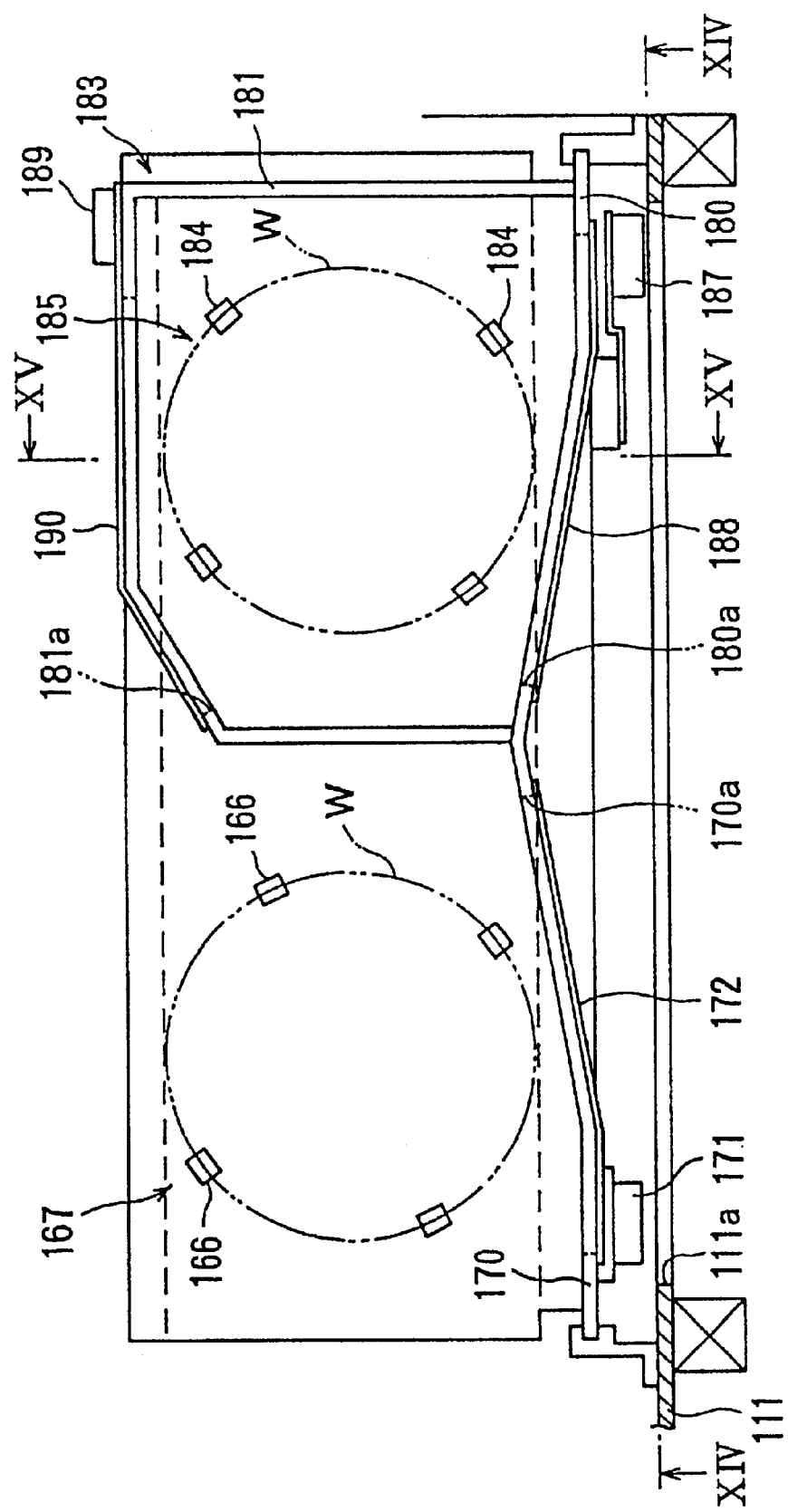
FIG. 13 is a plan view of a loading stage and a roughly cleaning chamber of the substrate plating apparatus shown in FIG. 11.

As shown in FIGS. 11 and 13, a loading stage 167 having a plurality (four in the illustrated embodiment) of support bases 166 is mounted in the clean zone 113 adjacent to the partition 111. The transfer unit 161 in the clean zone 113 holds a semiconductor wafer W to be plated and places the semiconductor wafer W onto the support bases 166 of the loading stage 167, and then the transfer unit 162 in the contaminated zone 112 picks up the semiconductor wafer W from the support bases 166.

As shown in FIG. 13, a partition wall 170 is disposed between the loading stage 167 and the partition 111. The partition wall 170 has an opening 170a defined therein for passage of the grip hand 164 of the transfer unit 162 therethrough and a shutter 172 actuatable by a cylinder 171 for opening and closing the opening 170a. The partition 111 also has an opening 111a defined therein for passage of the grip hand 164 of the transfer unit 162 therethrough.

A roughly cleaning chamber 183 is positioned adjacent to the partition 111 in juxtaposed relation to the loading stage 167. The roughly cleaning chamber 183 is defined as a box by a rear partition wall 180 contiguous to the partition wall 170, a front partition wall 181 of a substantially C-shape joined to the rear partition wall 180, and a ceiling 182 (see FIG. 15). The roughly cleaning chamber 183 accommodates an unloading stage 185 having a plurality of (four in the illustrated embodiment) support bases 184. The unloading stage 185 is identical in structure to the loading stage 167.

As shown in FIG. 15, two vertically spaced arrays of ejection nozzles 186 for ejecting a cleaning solution are disposed in the roughly cleaning chamber 183.

As shown in FIGS. 13 and 15, the rear partition wall 180 has an opening 180a defined therein for passage of the grip hand 164 of the transfer unit 162 in the contaminated zone 112 therethrough and a shutter 188 actuatable by a cylinder 187 for opening and closing the opening 180a. The front partition wall 181 has an opening 181a defined therein for passage of a grip hand of the transfer unit 161 in the clean zone 113 therethrough and a shutter 190 actuatable by a cylinder 189 for opening and closing the opening 181a. The opening 111a in the partition 111 extends from a position behind the loading stage 167 all the way to a position behind the roughly cleaning chamber 183 for allowing the grip hand 164 of the transfer unit 162 to move freely toward and away from the openings 170a, 180a.

Figure 14:
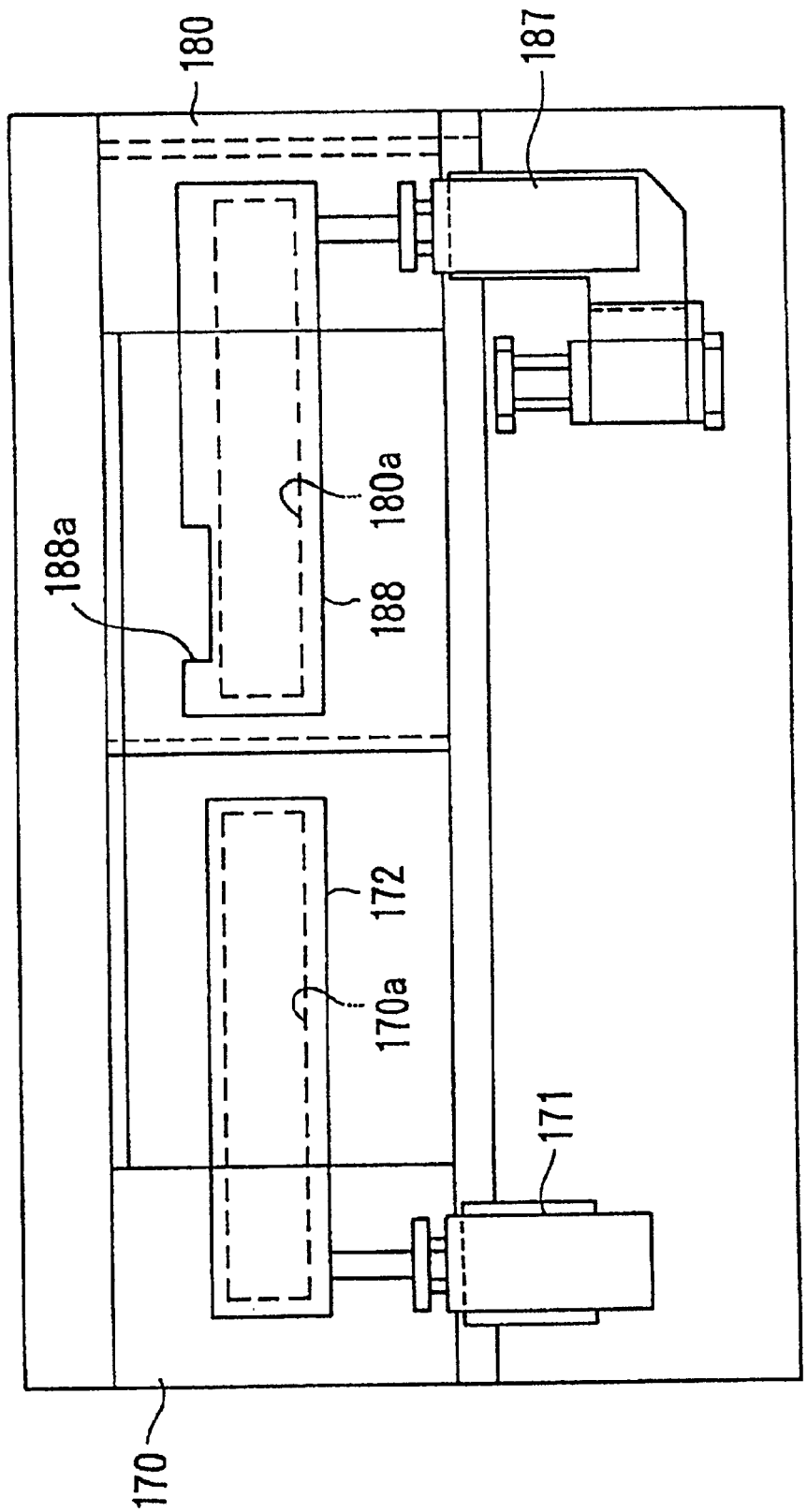
FIG. 14 is a cross-sectional view taken along line XIV—XIV of FIG. 13.

As shown in FIG. 14, the shutter 188 has a recess 188a defined in an upper edge thereof for passage therethrough of only the arms 163 of the transfer unit 162.

The grip hand 164 of the transfer unit 162 in the contaminated zone 112 can be inserted through the recess 188a into the roughly cleaning chamber 183. Therefore, the grip hand 164 and a plated semiconductor wafer W gripped thereby can be roughly cleaned in the roughly cleaning chamber 183. After the grip hand 164 and the plated semiconductor wafer W gripped thereby are roughly cleaned, the grip hand 164 places the semiconductor wafer W onto the support bases 184 of the unloading stage 185. The semiconductor wafer W placed on the support bases 184 is roughly cleaned again, and thereafter picked up by the transfer unit 161 in the clean zone 113.

More specifically, the shutter 188 is opened by being lowered by the cylinder 187, and a plated semiconductor wafer W gripped by the grip hand 164 of the transfer unit 162 is introduced into the roughly cleaning chamber 183. The shutter 188 is then lifted, and with the arms 163 of the transfer unit 162 being inserted through the recess 188a, the ejection nozzles 186 eject a cleaning solution to the semiconductor wafer W for thereby roughly cleaning the grip hand 164 and the semiconductor wafer W. Thereafter, the roughly cleaned semiconductor wafer W is placed onto the support bases 184, and the grip hand 164 is retracted out of the roughly cleaning chamber 183. Then, the shutter 188 is fully closed.

Then, the ejection nozzles 186 eject a cleaning solution again to the semiconductor wafer W on the support bases 184 for roughly cleaning the semiconductor wafer W again. Thereafter, the shutter 190 is opened, and the grip hand of the transfer unit 161 in the clean zone 113 is inserted into the roughly cleaning chamber 183. After the grip hand of the transfer unit 161 picks up the semiconductor wafer W and removes the semiconductor wafer W from the roughly cleaning chamber 183, the shutter 190 is closed.

Because the grip hand 164 of the transfer unit 162 in the contaminated zone 112 is roughly cleaned together with the plated semiconductor wafer W, the plating solution is prevented from being applied to and deposited on the grip hand 164. Consequently, the grip hand 164 does not transfer any substantial contamination to the transfer unit 161 in the clean zone 113.

In the illustrated sixth embodiment, the clean zone 113 accommodates the loading stage 167 and the roughly cleaning chamber 183, which houses the unloading stage 185. However, the loading stage 167 and the roughly cleaning chamber 183 which houses the unloading stage 185 may be disposed in the contaminated zone 112.

In the illustrated embodiments, the present invention is applied to the substrate plating apparatus for plating a semiconductor wafer. However, the principles of the present invention are also applicable to a substrate plating apparatus for plating a substrate other than a semiconductor wafer. Furthermore, a region on a substrate plated by the substrate plating apparatus is not limited to an interconnection region on the substrate. The substrate plating apparatus may be used to plate substrates with a metal other than copper.

Although certain preferred embodiments of the present invention have been shown and described in detail, it should be understood that various changes and modifications may be made therein without departing from the scope of the appended claims.

What is claimed is:

1. An apparatus for forming a layer on a substrate, comprising:
   a loading and unloading area to transfer a substrate;
   a plating area to form a layer on the substrate;
   a concentration analyzing device to analyze concentrations of components of a plating solution used by said plating area; and
   a cleaning and drying area to clean and dry the substrate.

2. The apparatus according to claim 1, wherein said concentration analyzing device includes at least one of:
   (i) a copper ion concentration analyzer;
   (ii) an oxidizing agent concentration analyzer;
   (iii) a reducing agent concentration analyzer;
   (iv) a pH measuring unit;
   (v) an oxygen concentration analyzer; and
   (vi) a plating additive concentration analyzer.

3. The apparatus according to claim 1, further comprising:
   a plating solution preparing device to prepare a plating solution based on the concentrations analyzed by said concentration analyzing device.

4. The apparatus according to claim 1, wherein said loading and unloading area includes a transfer device to transfer the substrate from said plating area to said loading and unloading area.

5. The apparatus according to claim 4, wherein said transfer device comprises a robot.

6. The apparatus according to claim 4, wherein said transfer device comprises a first transfer unit and a second transfer unit.

7. The apparatus according to claim 6, wherein said first transfer unit is to transfer the substrate between said loading and unloading area and said cleaning and drying area and said second transfer unit is to transfer the substrate between said cleaning and drying area and said plating area.

8. The apparatus according to claim 1, wherein said plating area includes a transfer device.

9. The apparatus according to claim 8, wherein said transfer device comprises a robot.

10. The apparatus according to claim 1, wherein the first layer is a copper layer.

11. The apparatus according to claim 1, further comprising:
airflow ducts for forming airflows in said plating area.

12. The apparatus according to claim 1, wherein said plating area includes at least one pretreatment chamber containing a pretreatment solution bath and at least one plating chamber containing a plating solution bath.

13. The apparatus according to claim 1, wherein said cleaning and drying area is disposed between said loading and unloading area and said plating area.

14. The apparatus according to claim 1, wherein said plating area includes a plating unit to electrolessly form a copper layer on the substrate.

15. The apparatus according to claim 1, wherein said cleaning and drying area includes a first cleaning and drying arrangement and a second cleaning and drying arrangement.

16. The apparatus according to claim 15, wherein said apparatus includes a generally longitudinally extending line passing through said loading and unloading area, said cleaning and drying area and said plating area, and wherein said first and second cleaning and drying arrangements are positioned on opposite sides of said generally longitudinally extending line.

17. The apparatus according to claim 16, wherein said cleaning and drying area is disposed between said loading and unloading area and said plating area in a direction of said generally longitudinally extending line.

18. A substrate plating apparatus installed in a clean room for plating a semiconductor substrate, comprising:
a plating unit comprising at least one plating chamber for containing a plating solution for plating a metal layer on the semiconductor substrate, wherein air pressure in said plating unit is lower than air pressure in said clean room;
a concentration analyzing device to analyze concentrations of the plating solution, wherein said concentration analyzing device comprises a metal ion concentration analyzer and a plating additive concentration analyzer;
a plating solution preparing unit for preparing the plating solution based on analyzed results from said concentration analyzing device; and
a cleaning and drying unit for cleaning and drying the plated semiconductor substrate.

19. The apparatus according to claim 18, wherein said concentration analyzing device includes at least one of:
(i) a copper ion concentration analyzer;
(ii) an oxidizing agent concentration analyzer;
(iii) a reducing agent concentration analyzer;
(iv) a pH measuring unit;
(v) an oxygen concentration analyzer; and
(vi) a plating additive concentration analyzer.

20. The apparatus according to claim 18, further comprising:
a loading and unloading area including a transfer device to transfer the substrate from said plating unit to said loading and unloading area.

21. The apparatus according to claim 20, wherein said transfer device comprises a robot.

22. The apparatus according to claim 21, wherein said transfer device comprises a first transfer unit and a second transfer unit.

23. The apparatus according to claim 22, wherein said first transfer unit is to transfer the substrate between said loading and unloading area and said cleaning and drying unit and said second transfer unit is to transfer the substrate between said cleaning and drying unit and said plating unit.

24. The apparatus according to claim 18, wherein said plating unit includes a transfer device.

25. The apparatus according to claim 24, wherein said transfer device comprises a robot.

26. The apparatus according to claim 18, wherein the first layer is a copper layer.

27. The apparatus according to claim 18, further comprising:
airflow ducts for forming airflows in said plating unit.

28. The apparatus according to claim 18, wherein said plating unit includes at least one pretreatment chamber containing a pretreatment solution bath and at least one plating chamber containing a plating solution bath.

29. The apparatus according to claim 18, further comprising:
a loading and unloading area,
wherein said cleaning and drying unit is disposed between said loading and unloading area and said plating unit.

30. The apparatus according to claim 18, wherein said plating unit includes an electroless plating unit to electrolessly form a copper layer on the substrate.

31. The apparatus according to claim 18, wherein said cleaning and drying unit includes a first cleaning and drying arrangement and a second cleaning and drying arrangement.

32. The apparatus according to claim 31, further comprising:
a loading and unloading area,
wherein said apparatus includes a generally longitudinally extending line passing through said loading and unloading area, said cleaning and drying unit and said plating unit, and wherein said first and second cleaning and drying arrangements are positioned on opposite sides of said generally longitudinally extending line.

33. The apparatus according to claim 32, wherein said cleaning and drying unit is disposed between said loading and unloading area and said plating unit in a direction of said generally longitudinally extending line.

34. A substrate plating apparatus for plating a semiconductor substrate, comprising:
at least one plating chamber for containing a plating solution for electrolessly plating a metal layer on the semiconductor substrate;
a concentration analyzing device to analyze concentrations of the plating solution, wherein said concentration analyzing device comprises a metal ion concentration analyzer, a plating additive concentration analyzer, and a pH measuring unit;
a plating solution preparing unit for preparing the plating solution based on analyzed results from said concentration analyzing device; and
a cleaning and drying unit for cleaning and drying the plated semiconductor substrate.

35. The apparatus according to claim 34, wherein said concentration analyzing device includes at least one of:
(i) a copper ion concentration analyzer;

(ii) an oxidizing agent concentration analyzer;
(iii) a reducing agent concentration analyzer;
(iv) a pH measuring unit;
(v) an oxygen concentration analyzer; and
(vi) a plating additive concentration analyzer.

36. The apparatus according to claim 34, further comprising:
a loading and unloading area including a transfer device to transfer the substrate from said at least one plating chamber to said loading and unloading area.

37. The apparatus according to claim 36, wherein said transfer device comprises a robot.

38. The apparatus according to claim 36, wherein said transfer device comprises a first transfer unit and a second transfer unit.

39. The apparatus according to claim 38, wherein said first transfer unit is to transfer the substrate between said loading and unloading area and said cleaning and drying unit and said second transfer unit is to transfer the substrate between said cleaning and drying unit and said at least one plating chamber.

40. The apparatus according to claim 34, further comprising:
a transfer device associated with said at least one plating chamber.

41. The apparatus according to claim 40, wherein said transfer device comprises a robot.

42. The apparatus according to claim 34, wherein the first layer is a copper layer.

43. The apparatus according to claim 34, further comprising:
airflow ducts for forming airflows in the vicinity of said at least one plating chamber.

44. The apparatus according to claim 34, further comprising:
at least one pretreatment chamber containing a pretreatment solution bath.

45. The apparatus according to claim 34, further comprising:
a loading and unloading area,
wherein said cleaning and drying unit is disposed between said loading and unloading area and said at least one plating chamber.

46. The apparatus according to claim 34, further comprising:
a plating unit that includes said at least one plating chamber.

47. The apparatus according to claim 34, wherein said cleaning and drying unit includes a first cleaning and drying arrangement and a second cleaning and drying arrangement.

48. The apparatus according to claim 47 further comprising:
a loading and unloading area; and
a plating unit that includes said at least one plating chamber,
wherein said apparatus includes a generally longitudinally extending line passing through said loading and unloading area, said cleaning and drying unit and said plating unit, and wherein said first and second cleaning and drying arrangements are positioned on opposite sides of said generally longitudinally extending line.

49. The apparatus according to claim 48, wherein said cleaning and drying unit is disposed between said loading and unloading area and said plating unit in a direction of said generally longitudinally extending line.

* * * * *